United States Patent [19]
Varnham et al.

[11] Patent Number: 5,226,321
[45] Date of Patent: Jul. 13, 1993

[54] VIBRATING PLANAR GYRO

[75] Inventors: Malcolm P. Varnham; Diana Hodgins; Timothy S. Norris; Huw D. Thomas, all of Stevenage Herts, England

[73] Assignee: British Aerospace Public Limited Company, London, England

[21] Appl. No.: 701,533

[22] Filed: May 17, 1991

[30] Foreign Application Priority Data

May 18, 1990 [GB] United Kingdom ............. 9011185
Mar. 11, 1991 [GB] United Kingdom ............. 9105060

[51] Int. Cl.$^5$ .................................................. G01P 9/04
[52] U.S. Cl. ...................................... 73/505; 73/517 A
[58] Field of Search .................... 73/505, 510, 517 A, 73/517 AV

[56] References Cited

U.S. PATENT DOCUMENTS

| | | | |
|---|---|---|---|
| 3,924,475 | 12/1975 | Stiles | 73/505 |
| 4,281,384 | 7/1981 | Groom et al. | 73/510 |
| 4,578,650 | 3/1986 | Watson | 73/505 |
| 4,654,663 | 3/1987 | Alsenz et al. | 73/505 |

FOREIGN PATENT DOCUMENTS

| | | |
|---|---|---|
| 0307321 | 3/1989 | European Pat. Off. . |
| 1288118 | 9/1972 | United Kingdom . |
| 2021266A | 11/1979 | United Kingdom . |
| 2156523A | 10/1985 | United Kingdom . |
| 2158579A | 11/1985 | United Kingdom . |
| 2164749A | 3/1986 | United Kingdom . |
| 2186085A | 8/1987 | United Kingdom . |

*Primary Examiner*—John E. Chapman
*Attorney, Agent, or Firm*—Nixon & Vanderhye

[57] ABSTRACT

A vibrating planar ring or hoop-like structure is disclosed. The structure is suspended in space by a suitable support mount for detecting turning rate, linear acceleration and angular acceleration. Turning rate is sensed by detecting vibrations coupled by Coriolis forces, whereas linear acceleration and angular acceleration are sensed by lateral, vertical and rocking movement of the entire ring or hoop-like structure within its mount.

8 Claims, 13 Drawing Sheets

$F_{DY} = \hat{F} \sin wt$ $F_{DY}$ = DRIVE EXCITATION FORCE IN y DIRECTION $F_{cx}$ = CORIOLIS FORCE IN x DIRECTION DUE TO APPLICATION OF TURNING RATE $\Omega$ $F_R$ = RESULTANT FORCE FROM $F_{DY}$ AND $F_{cx}$ Fig. 3. (PRIOR ART)
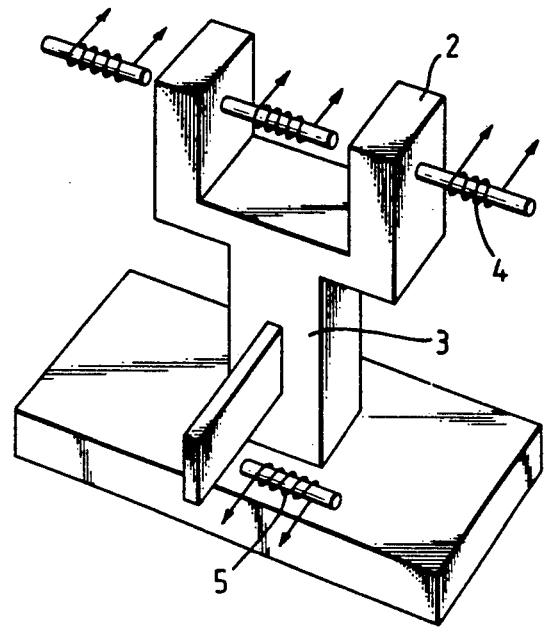
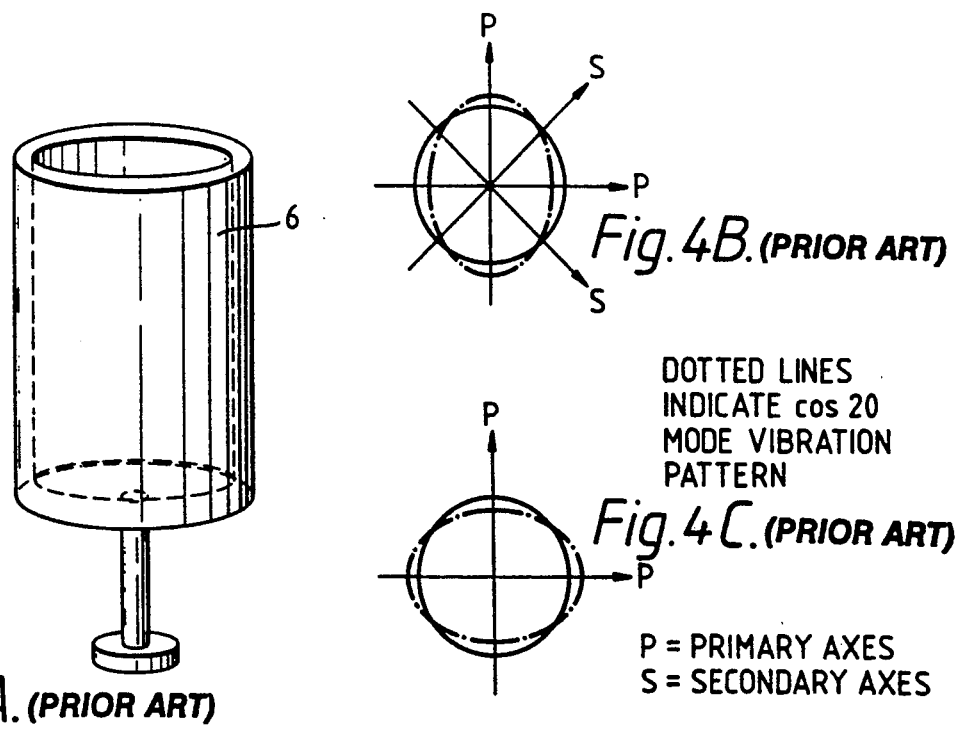
Fig. 4A. (PRIOR ART)
Fig. 4B. (PRIOR ART)
DOTTED LINES INDICATE cos 2θ MODE VIBRATION PATTERN
Fig. 4C. (PRIOR ART)
P = PRIMARY AXES
S = SECONDARY AXES

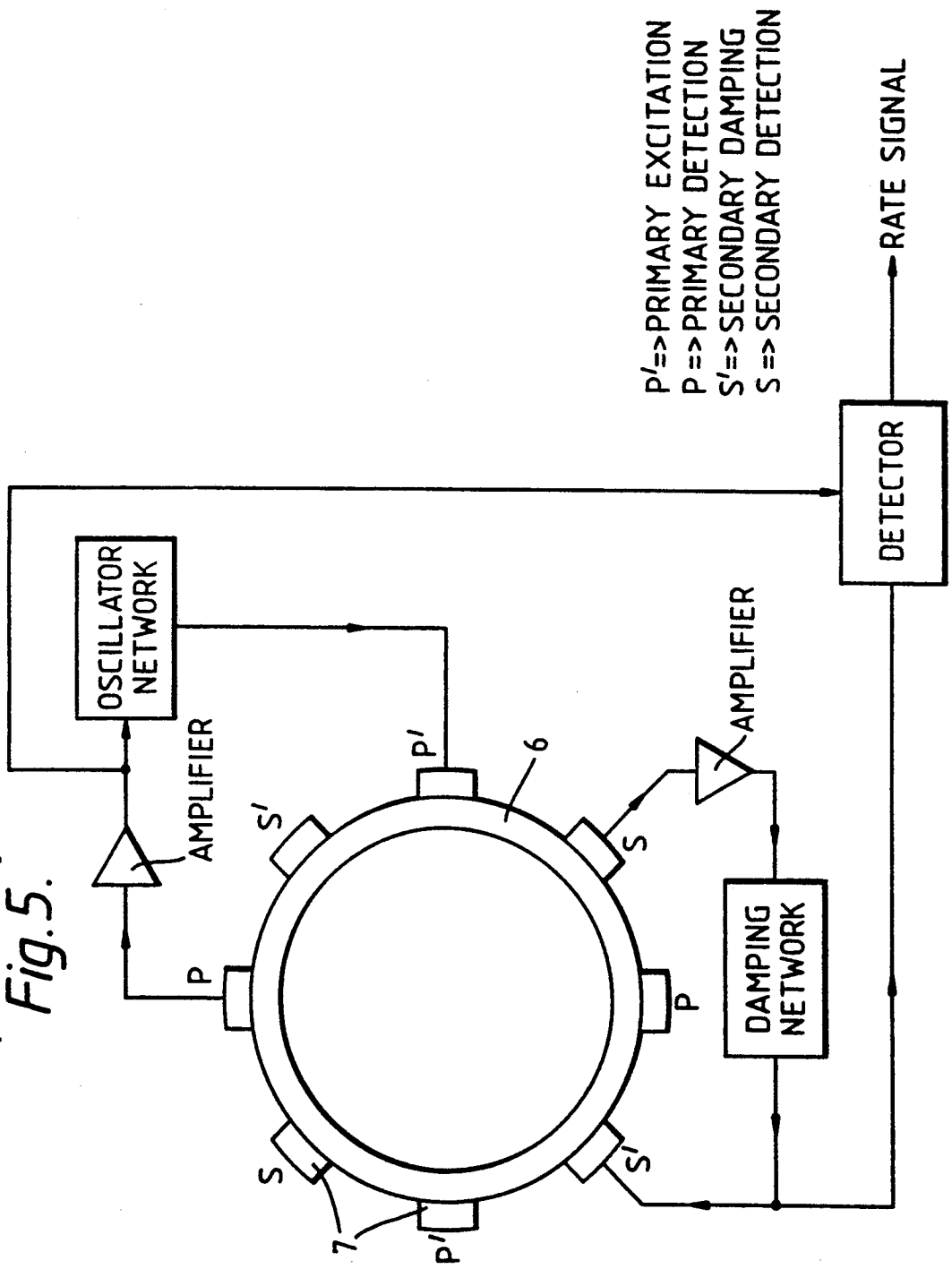

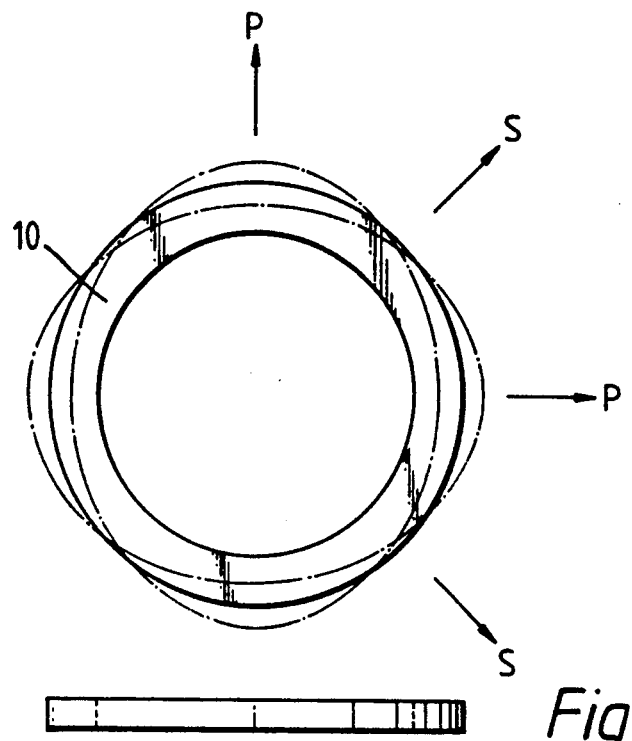
Fig.6A.
Fig.6B.
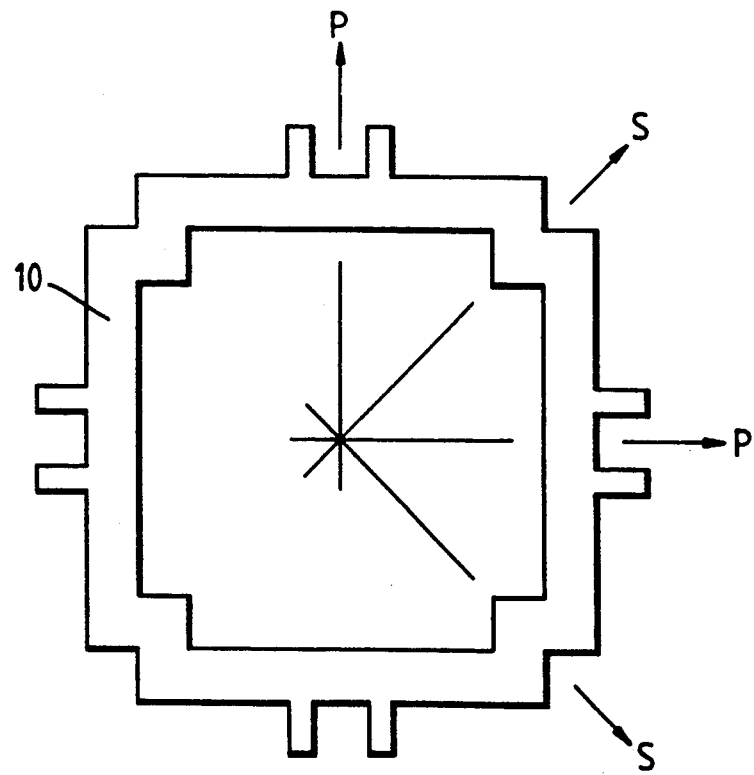
Fig.7.

Fig. 10.
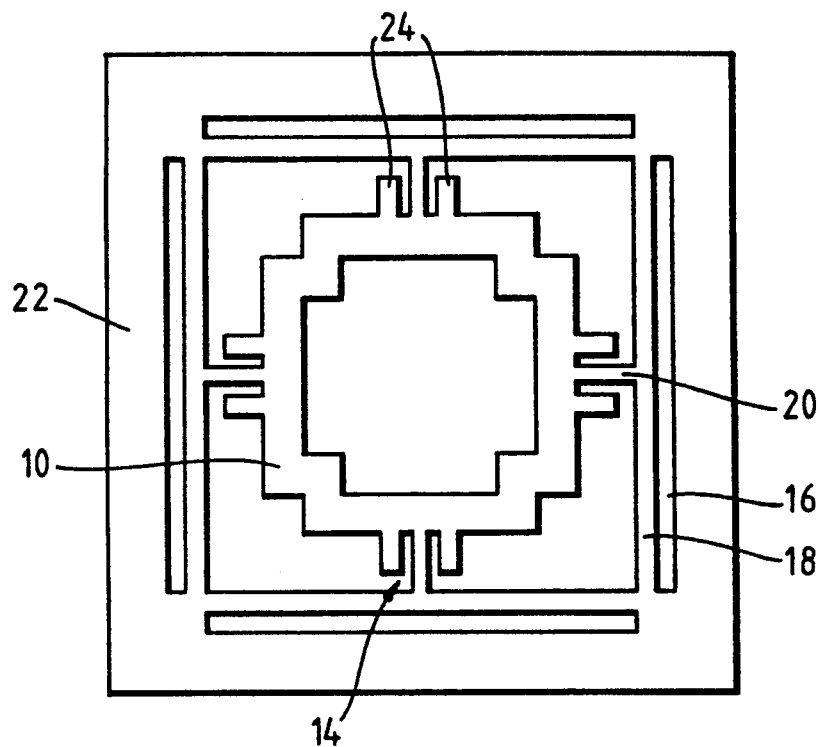
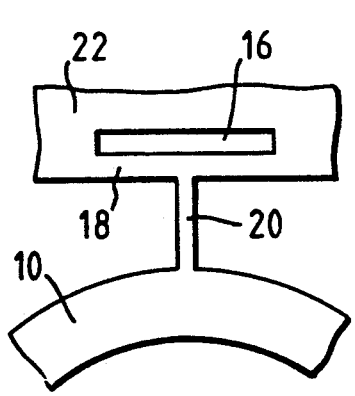
"T"-BAR
MOUNT
Fig. 11A.
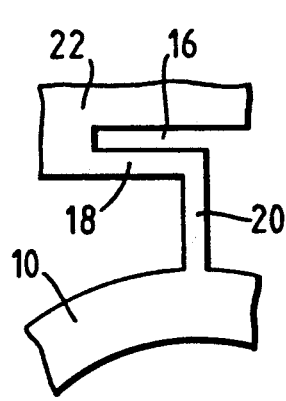
"L"-BAR
MOUNT
Fig. 11B.
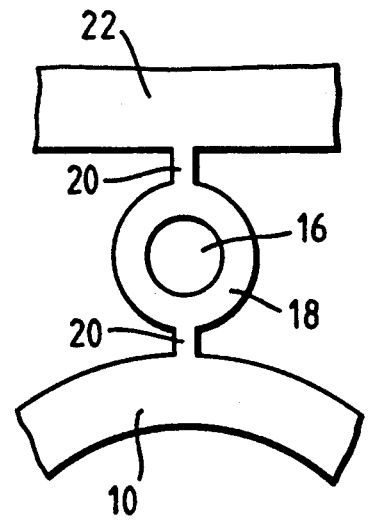
"O"-BAR
MOUNT
Fig. 11C.

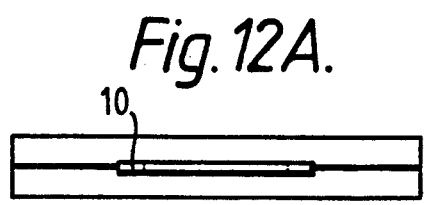
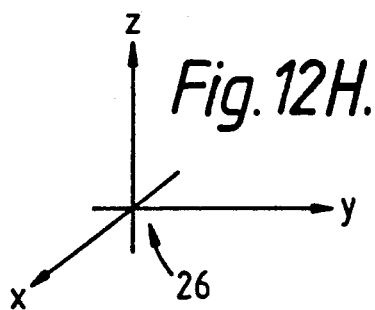
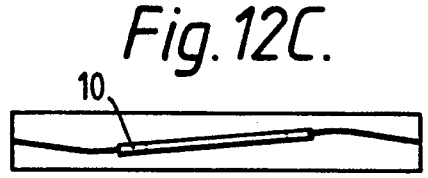
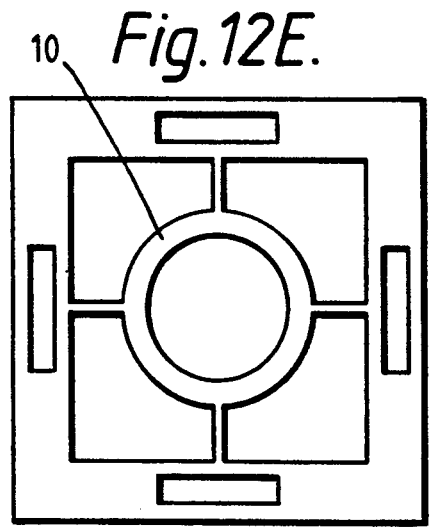
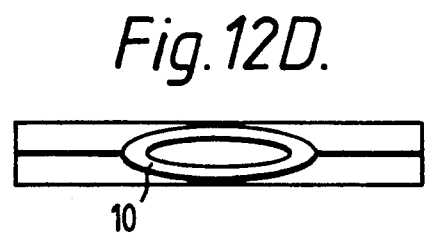
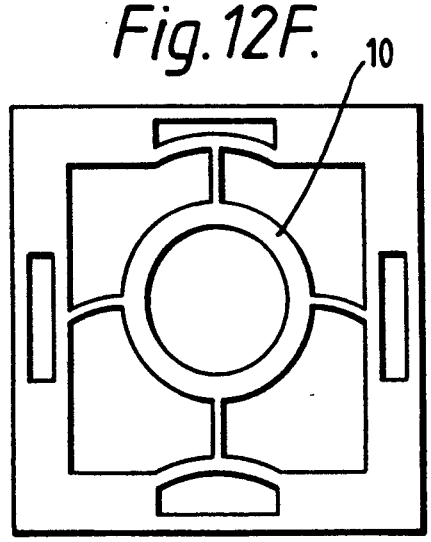
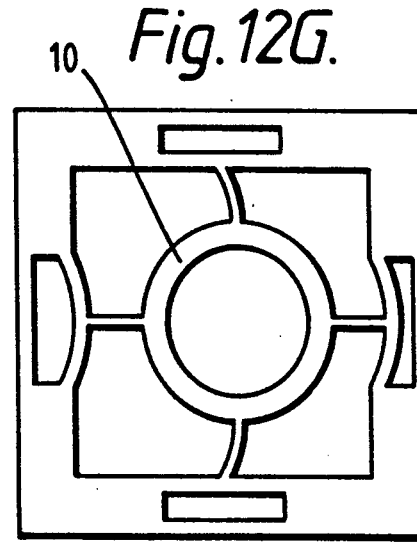

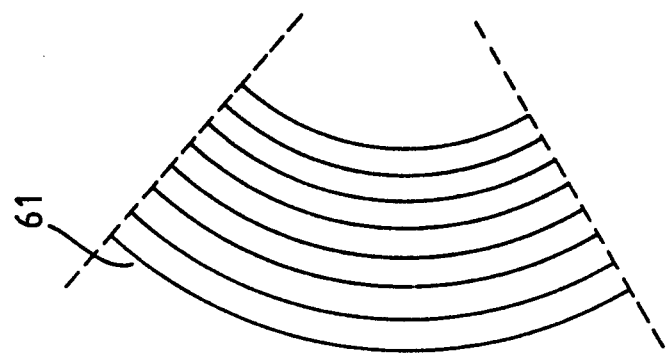
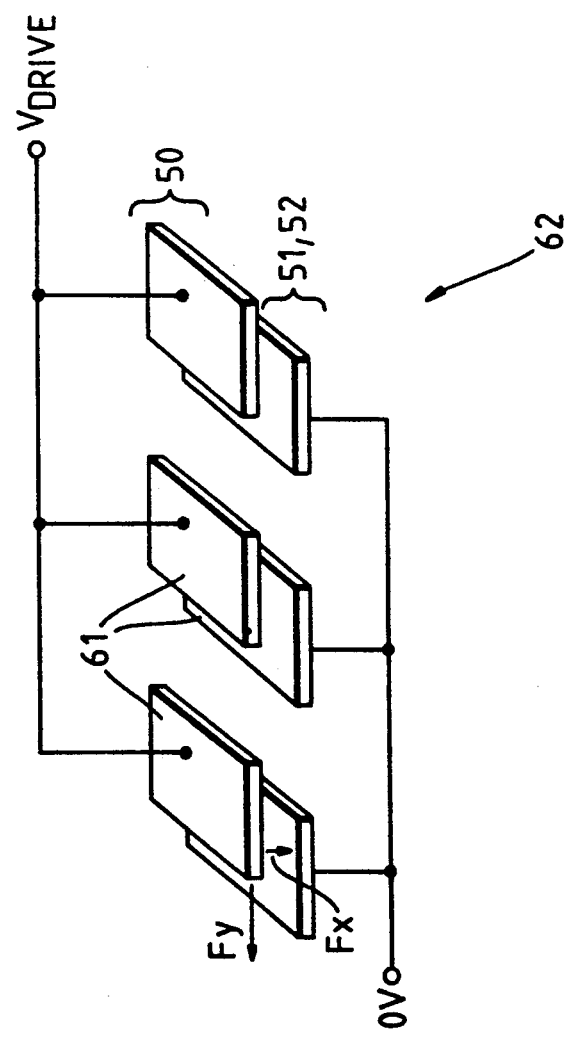

VIBRATING PLANAR GYRO

BACKGROUND OF THE INVENTION

1. Field of the Invention

This invention relates to sensors and more particularly to inertial sensors such as accelerometers and vibrating gyroscopes.

2. Discussion of Prior Art

Conventional gyroscopic sensors for measuring turning rate have utilized the action of Coriolis forces. In a rotating frame of reference, the Coriolis force acting on a rotating mass m is $$F = 2 \, w \, Vrel \, m$$

where
F = Coriolis force
w = turning rate
m = particle mass
Vrel = relative velocity of mass m to fixed reference frame.

The Coriolis force appears perpendicular to the plane containing the particle movement. This characteristic is utilized in conventional spinning-rotor gyroscopes where the axis of the rotor tries to maintain a constant direction in space as a result of the action of the Coriolis forces. Conventional mechanical gyroscopes contain parts such as gimbals, support bearings, motors and rotors which need accurate machining and assembly; these aspects of construction prohibit conventional mechanical gyroscopes from ever becoming an extremely low cost device. Wear on the motors and bearings during operation means that the gyroscope will only meet the performance specifications for a set number of running hours.

Alternatively, instead of a mass m following a circular trajectory as for the conventional spinning-rotor gyroscope, the mass can be suspended and made to move linearly in simple harmonic motion. FIG. 1 shows a simple form of such a vibrating rate sensor which comprises a simple mass 1 suspended in space and excited harmonically along one of its axes, in this example the y axis. Rotation about the z axis which is perpendicular to the y axis $F_{DY}$, along which the harmonic excitation occurs, results in motion along the third orthogonal x axis $F_{cx}$ as shown in FIG. 2. The amplitude of motion in the third orthogonal x axis $F_{cx}$ is proportional to applied turning rate. This simple arrangement has produced examples of a vibrating-beam rate sensor. One such example is described in the article "Vibrating Angular Rate Sensors," Gates, W. D., June 1968, *Electronics*, and comprises a machined bar of ceramic which exhibits piezo-electric properties. The disadvantage of the simple form of vibrating rate sensor described above is that it is an "unbalanced system" which makes it sensitive to linear acceleration.

In order to reduce sensitivity to linear acceleration, Sperry developed a vibrating tuning-fork gyroscope, given the title "Gyrotron", in 1940 [see "A New Space Rate Sensing Instrument," Lyman, J., pp. 24-30, November 1953, *Aeronautical Engineering Review*]. This device is shown in FIG. 3 and comprises a metallic tuning fork 2 mounted on a thin stem 3, surrounded by associated magnetic drive coils 4 and pickup coils 5. In this structure, the tines were vibrated 180° out of phase and therefore generated torque in the stem which was proportional to rate. The disadvantage of the tuning-fork gyroscope is the requirement to balance accurately the resonant frequencies of the two tines of the tuning fork. More recently, balanced tuning-fork gyroscopic devices have been fabricated by General Precision Industries (USA) in planar form by etching quartz substrates.

The concept of the balanced vibrating tuning fork gyroscope can be extended to an axi-symmetrical shell structure that exhibits identical Eigenmode frequencies. A commercially available rate sensor employing this resonator structure is the START gyroscope manufactured by Marconi (GEC). Patent GB 2061 502A describes this sensor and FIGS. 4 and 5 show the construction of this hollow, thin-walled cylindrical cup-like resonator structure 6 with bonded piezo-electric transducers 7 positioned on the outside circumference. The bonded piezo-electric transducers permit the excitation and monitoring of vibration in the resonator structure. The frequency of the vibration applied by means of the bonded primary axes transducers is chosen to coincide with a resonance of the structure. The FIGS. 4(A), 4(B), 4(C) and 5 illustrate the cos $2\theta$ (n=2) mode of vibration which is normally preferred since this gives the maximum radial displacement for a given rate input and drive excitation amplitude. Radial vibration corresponding to applied rate may be sensed along the secondary axes which, for the cos $2\theta$ mode, are at 45° to the primary axes. FIG. 5 also shows a form of excitation and detection circuit that could be used to provide a rate output signal; this is described in patents GB2061 502A and GB 2154 739A. The circuit includes a feedback system which excites vibration in the resonator along the primary axes. Radial secondary axes vibrations, resulting from Coriolis forces coupling radial vibration from the primary axes to the secondary axes, can be monitored and suitably amplified so that they may be applied back at the secondary axes to dampen the coupled radial vibrations. A phase detector is used to demodulate the secondary damping signal in order to provide the rate output signal.

For the cylindrical resonator with bonded transducers, balancing of the Eigenmode frequencies of the structure is required for satisfactory gyroscope operation; this balancing operation is an additional manufacturing process which increases cost. An evolution of the cylindrical structure with bonded piezo-electric transducers is to fabricate the entire resonator structure from a piezo-electric material such as radially-polarized ceramic with deposited metallic electrodes to facilitate electrical connection. This is described in patent GB 2061 502A where the shell is rigidly mounted at the base. The advantage of manufacturing a gyroscope resonator from a unitary mass of material is that it permits a low-cost device to be realised. However, the required sintered ceramic materials which exhibit the piezo-electric effect have mechanical properties which are not stable with temperature and time. Moreover, the mounting method employed, for example a stem or end clamp, can result in external stresses unbalancing the resonator and causing the Eigenmodes to have dissimilar frequencies, thereby introducing additional offsets in the detected rate signal.

SUMMARY OF THE INVENTION

One object of the present invention is to provide a relatively inexpensive sensor which overcomes many of the disadvantages of previously known systems.

According to one aspect of the present invention there is provided an inertial sensor comprising:

a vibratory resonator having inner and outer peripheral portions extending around a common axis, excitation means for causing the resonator to vibrate, support means for supporting the resonator and for allowing the resonator to vibrate in response to said excitation means and for allowing the resonator to move relative to the support means in response to linear and angular acceleration, and transducer means for sensing movement of the resonator.

BRIEF DESCRIPTION OF THE DRAWINGS

Embodiments of the invention will now be described, by way of example, with particular reference to FIGS. 1 to 18 of the accompanying drawings, in which:

FIG. 3 is a prior art tuning fork gyroscope;

FIGS. 4(A), 4(B) and 4(C) are a cylindrical resonator structure and respective diagrams illustrating vibration of the structure in primary and secondary modes;

FIG. 5 is a schematic of the vibrating sensor and associated detection circuitry;

FIGS. 6(A) and 6(B) shows a plan view of a ring resonator;

FIG. 7 shows a plan view of a hoop-like resonator;

FIG. 10 shows a plan view of a hoop-like resonator with an edge mechanical mount;

FIGS. 11(A), 11(B) and 11(C) show three examples of low-stiffness mounts which provide approximately free support to the resonator;

FIGS. 12(A)–(H) show the effect of linear and angular acceleration on the resonator ring in its support mount;

FIGS. 16(A) and 16(B) show a suitable electrode configuration for the resonator transducers;

DETAILED DISCUSSION OF PREFERRED EMBODIMENTS

FIGS. 6(A) and 6(B) and 7 show examples of planar resonators 10 which may be used in the embodiments of the invention to be described. Any ring or hoop-like structure, be it regular or irregular, may be used provided that, when resonating, the Eigenmode frequencies associated with the primary axes P and secondary axes S match as closely as possible so that they are, at least, within the bandwidth of resonance of the resonator. The primary axes P are the axes along which the resonator 10 is excited at a frequency chosen to coincide with its resonant frequency. Turning rate is determined by detecting Coriolis-coupled primary axes P vibrations along the secondary axes S; which, in the cos $2\theta$ mode of operation, are at 45° to the primary axes P. The broken lines in FIG. 6 show the effect of the cos $2\theta$ mode of operation on the resonator structure.

Figure 1:
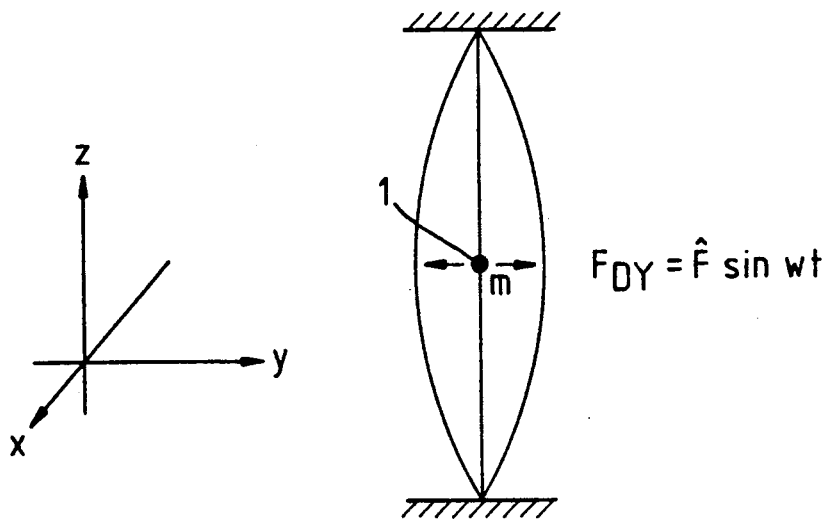
FIG. 1 is a schematic of a prior art vibrating beam sensor and its accompanying geometric axis.
Figure 2:
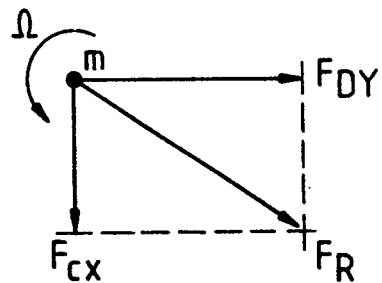
FIG. 2 is a vector diagram of the vibrations of the FIG. 1 sensor during rotation.
Figure 8:
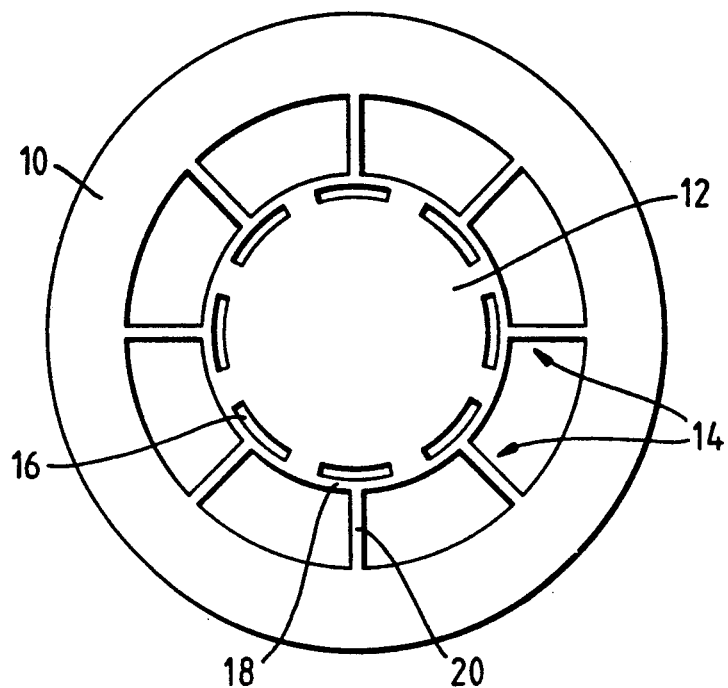
FIG. 8 shows a plan view of a planar ring resonator with a central mechanical mount.
Figure 9:
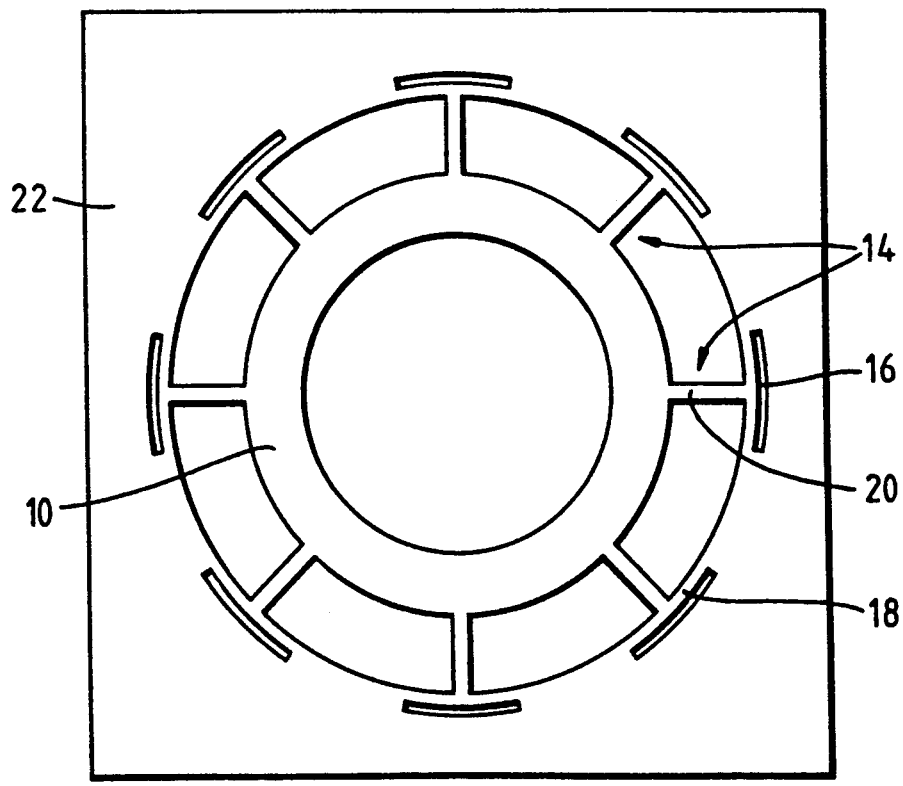
FIG. 9 shows a plan view of a planar ring resonator with an edge mechanical mount.
Figure 13A:
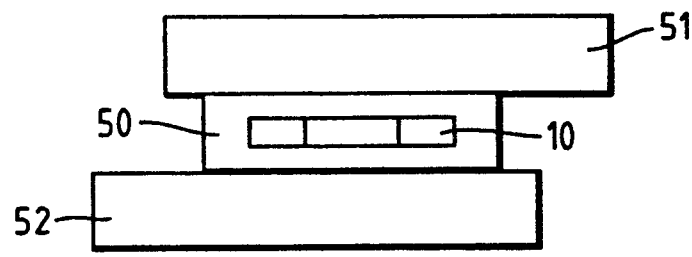
FIGS. 13(A)–13(C) show a triple layer sensor embodiment of the invention.
Figure 13B:
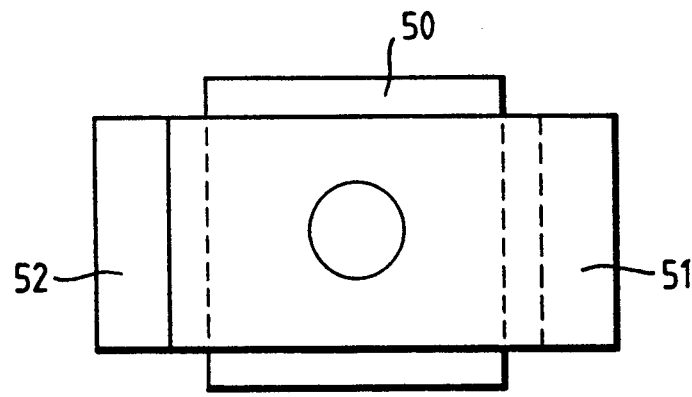
Figure 13C:
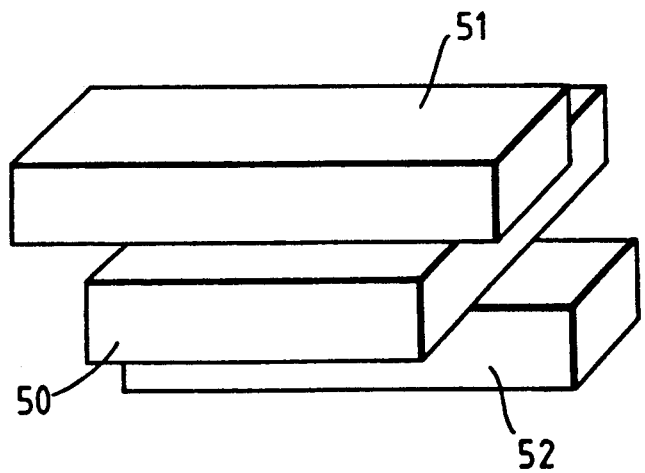
Figure 14:
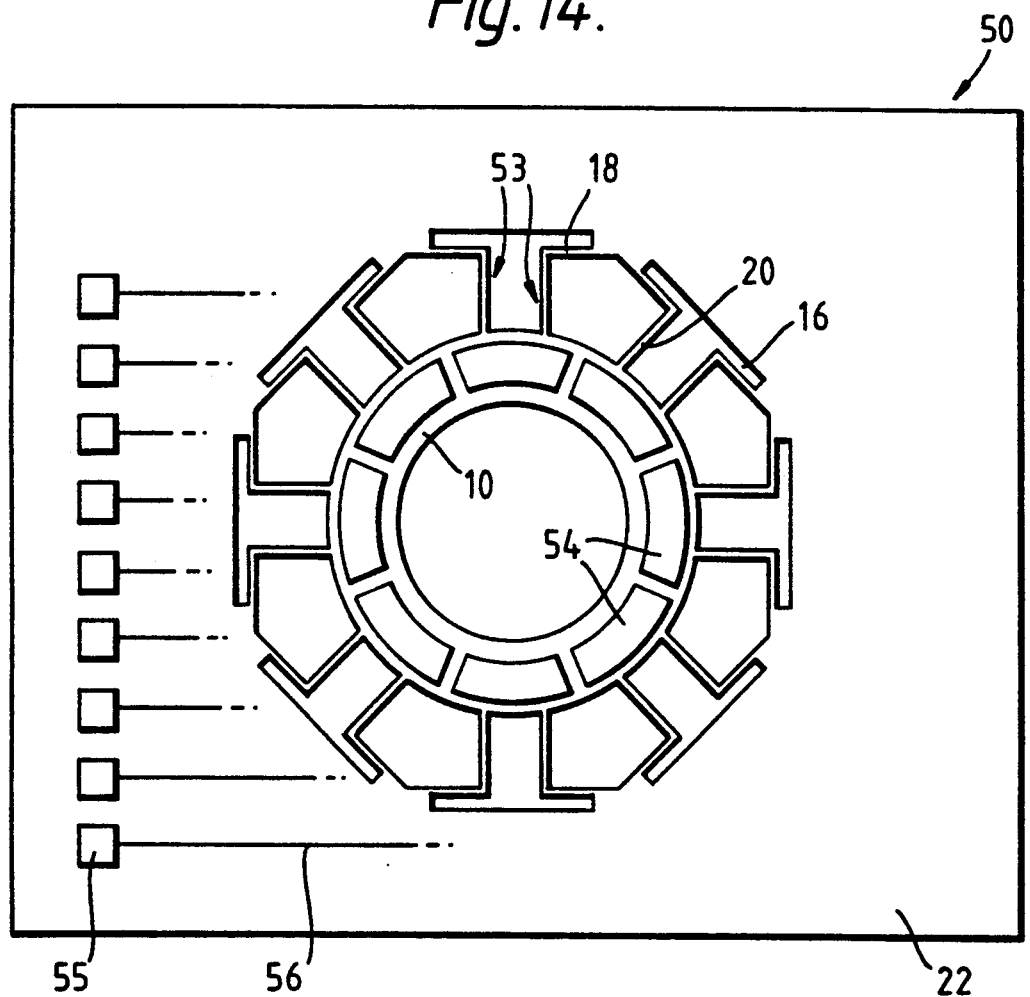
FIG. 14 shows a plan view of the centre layer of the triple layer sensor embodiment.
Figure 15A:
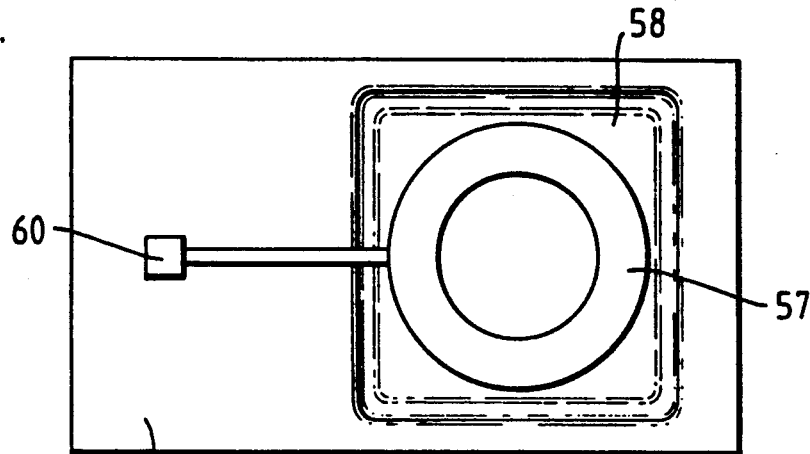
FIGS. 15(A), 15(B) and 15(C) show different views of the layers of the triple layer sensor embodiment.
Figure 15B:
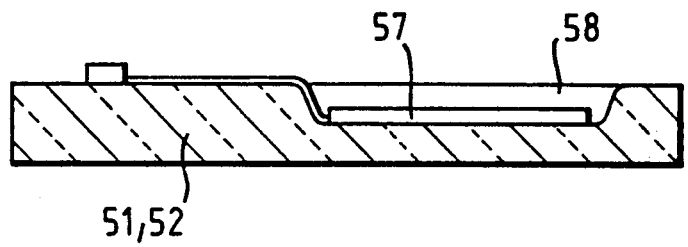
Figure 15C:
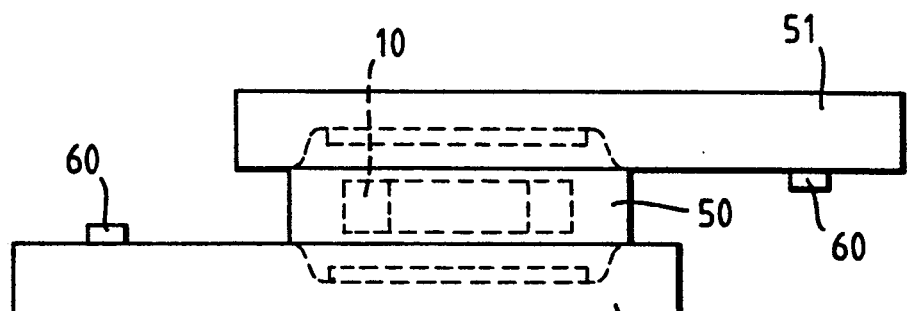

In order for the resonator 10 to function correctly, it must be supported in a way that allows it to vibrate as freely as possible. FIG. 8 shows a resonator 10 supported by a central mounting region 12 by means of a number of "T"-bar supports 14. The support bars comprise an aperture 16 defined within the mounting region 12, a cross beam 18 and a support beam 20. The longitudinal stiffness of the support beams 20 is designed to be less than the transverse stiffness of the resonator 10 so that the beam-supported resonator approximates a freely vibrating structure. FIGS. 9 and 10 show resonators 10 supported by an edge mounting 22. Again, low-stiffness "T"-bar supports 14 are used. The resonator 10 of FIG. 10 has the form of a square-shaped hoop and includes trimming masses (turning bars) 24 which assist in achieving the desired matching of Eigenmode frequencies.

FIG. 11(A) shows the "T"-bar support in more detail along with two alternatives—an "L"-bar support shown in FIG. 11(B) and and "O"-bar support shown in FIG. 11(C). All three supports have the longitudinal stiffness of the support beams 20 less than the transverse stiffness of the resonator 10, thus allowing the resonator 10 to approximate a freely-vibrating structure.

The substrate which forms the resonator 10, mounting 12, 22 and supports 14 may be a stable material such as glass, silicon or quartz wafer or sheet. In addition, the substrate may exhibit isotropic material properties, in which case the resonator 10 will take the general form of a ring. This is the case for amorphous material such as glass, for the <111> surface plane in monocrystalline silicon and also for the Z-cut plane in quartz. In order to fabricate a ring or hoop-like structure from a suitable substrate such as those described above, techniques similar to those used in the semiconductor manufacturing industry can be used. These techniques include dry plasma etching, aqueous acid or alkali etching, laser ablation, laser assisted gas etching, ion-beam sputtering or ion-beam assisted gas etching. Anisotropic alkaline wet etching is not considered to be suitable as other techniques for forming ring-like structures in monocrystalline materials because certain crystalline planes exhibit high relative etching rates. Thus, for these monocrystalline materials etched using anisotropic alkaline etches, it is more appropriate for the resonator to assume a more couplex hoop-like form such as that shown in FIGS. 7 and 10. These manufacturing techniques are believed to give high accuracy, thus enabling Eigenfrequencies to be easily matched.

FIGS. 12 shows the effect of linear and angular acceleration on the resonator 10. The coordinate system shown in FIG. 12(H) at 26 should be used to assist in interpretation of FIGS. 12A to 12G. FIG. 12A shows a side view of the resonator 10 under conditions of no acceleration; 12B shows the effect of z axis linear acceleration; 12C shows the effect of angular acceleration about the x axis; 12D shows the effect of angular acceleration about the y axis; 12E shows a plan view of the resonator 10 under conditions of no acceleration; 12F shows the effect of x axis linear acceleration; and 12G shows the effect of y axis linear acceleration, The resonator shown is of the edge mounted type, although it will be understood that the centrally mounted type would behave in a similar way.

The resonator 10 may be excited into vibration by any suitable transducers. These may function by means of optical, thermal expansion, piezo-electric, electro-static or electro-magnetic effects, for example. The excitation may be applied to the support structure which carries resonator 10, or directly to the resonator itself.

Resonator vibration along the secondary axes (which gives an indication of turning rate) and lateral or rocking movement of the resonator within its mount 12 or 22 (which gives an indication of linear and angular acceleration) may, for example, be sensed by transducers working electromagnetically, capacitively, optically, piezo-electrically or by means of strain gauges. Capacitive sensing is believed to provide the best method by incorporating electrode plates in close proximity to the resonator 10 in positions above and below the plane of the resonator.

A triple substrate embodiment of the invention which employs capacitive sensing is shown in FIGS. 13 to 18. The resonator 10 is formed in the center plate 50 which comprises a suitable substrate and lies between upper plate 51 and lower plate 52 as shown in FIGS. 13(A), 13(B) and 13(C). The center plate 50 may be <111> cut silicon and the upper and lower plates may be glass, quartz or fused silica in order to permit viewing of the center plate 50, thus allowing alignment with the resonator 10 and the matching of Eigenfrequencies by laser ablation of the resonator 10 (and trimming masses, if appropriate). The center plate 50 comprises edge mounting 22 which supports ring resonator 10 by means of a series of "L"-bar supports 53. The conductive center substrate is uniformly coated with insulating silicon dioxide or silicon nitride. Electrodes 54 are formed on the upper and lower faces of the coated resonator 10, these being electrically connected to the peripheral connection pads 55 by way of tracks 56 that run from the pads 55 and along the "L"-beams 53. The center substrate is electrically connected to some suitable fixed potential so that capacitive cross-talk cannot occur between tracks 56 via the substrate. The upper and lower plates 51 and 52 have a similar design to one another, and each include annular electrodes 57 formed in a recess 58 as shown in FIGS. 15(A), 15(B) & 15(C). When the sensor is assembled, the recesses 58 of the upper and lower plates 51 and 52 are arranged so that their electrodes 57 overlap the electrodes 54 of the centre plate 50. A constant bias potential is applied to each of the electrodes 57 in order that electrostatic forces can be generated and resonator ring vibration can be detected by capacitive pick-up, the signals from the electrodes 57 being made available at terminals 60.

A suitable design for the electrodes of each of the plates is shown in FIGS. 16(A) and 16(B). They may each comprise a series of concentric electrode strips 61, having a similar periodicity in the electrodes of the upper, lower and central plates 51, 52 and 50. As shown generally at 50, the electrode strips of the upper and lower plates 51 and 52 are skewed relative to the electrode strips of the center plate 50, i.e., the electrode strips of the outer plates 51, 52 and the central plate 50 are not laterally aligned. This arrangement allows lateral and normal forces $F_y$ and $F_x$ to be applied to the resonator 10 by applying voltages to the electrodes 54 of the center plate 50. Likewise, detection of both lateral and normal movement is made possible by appropriate signal processing (such as that to be described later with reference to FIG. 18) applied to the signal current generator in electrodes 54, these electrodes functioning as vibration pick-up transducers. The signal processing may excite and detect cos 2θ mode along the primary axes, detect and dampen cos 2θ mode along the secondary axes, and detect lateral, vertical and rocking motions of the resonator 10 within its "L"-beam support mount.

Figure 17:
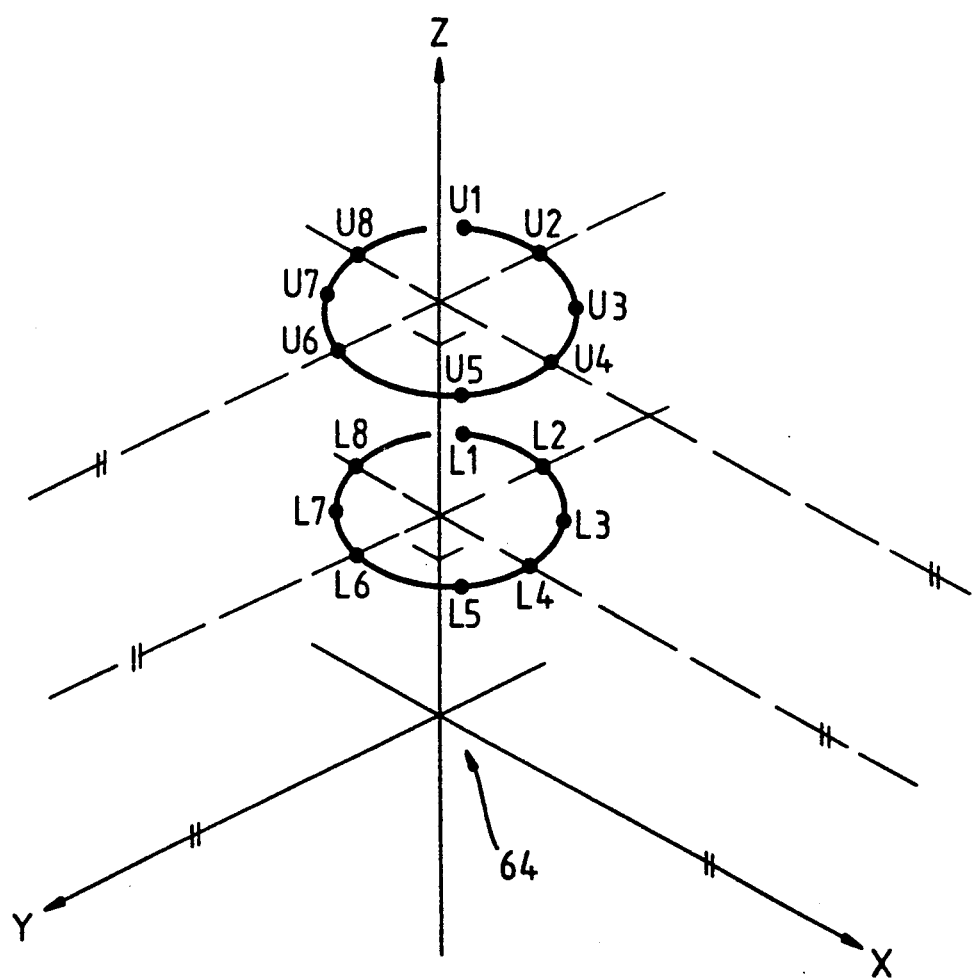
FIG. 17 shows a transducer arrangement in schematic form for a planar ring resonator.

FIG. 17 show schematically the positions of two sets of transducers U1-U8 and L1-L8 located above and below the resonator respectively. If, for example, each of the transducers U1, L1, U2, etc took the form of the capacitive sensor described above, each transducer would comprise two sets of concentric electrode strips, one set located on the upper or lower surface of the resonator, and the other set located on the upper or lower plates 51 or 52 of the sensor. Each transducer produces an output signal which is representative of the distance between its respective sets of the electrode strips.

Thus, the output of the transducers gives an indication of acceleration and turning rate. By way of example, if we assume that (a) transducers U4, L4, U8 and L8 are used to excite primary cos 20 mode vibration; (b) downward movement of the lower transducers L1-L8 produces a similar output signal sense to upward movement of the upper transducers U1-U8; and (c) lateral movement of the resonator causes a similar sense of output signal from the upper and lower transducers, the signal summations shown in the table below permit the detection of acceleration and turning rate applied to the sensor when interpreted using the co-ordinate system shown at 64.

| Inertial measurement | Signal summation |
| --- | --- |
| Z - axis linear acceleration | (U2 + U6) − (L2 + L6) |
| X - axis linear acceleration | (U8 + L8) − (L4 + U4) |
| Y - axis linear acceleration | (U6 + L6) − (L2 + U2) |
| Z - axis turning rate | (U7 + U3 + L7 + L3) |
| Angular acceleration about X - axis | (U6 + L2) − (U2 + L6) |
| Angular acceleration about Y - axis | (U8 + L4) − (U4 + L8) |

Figure 18:
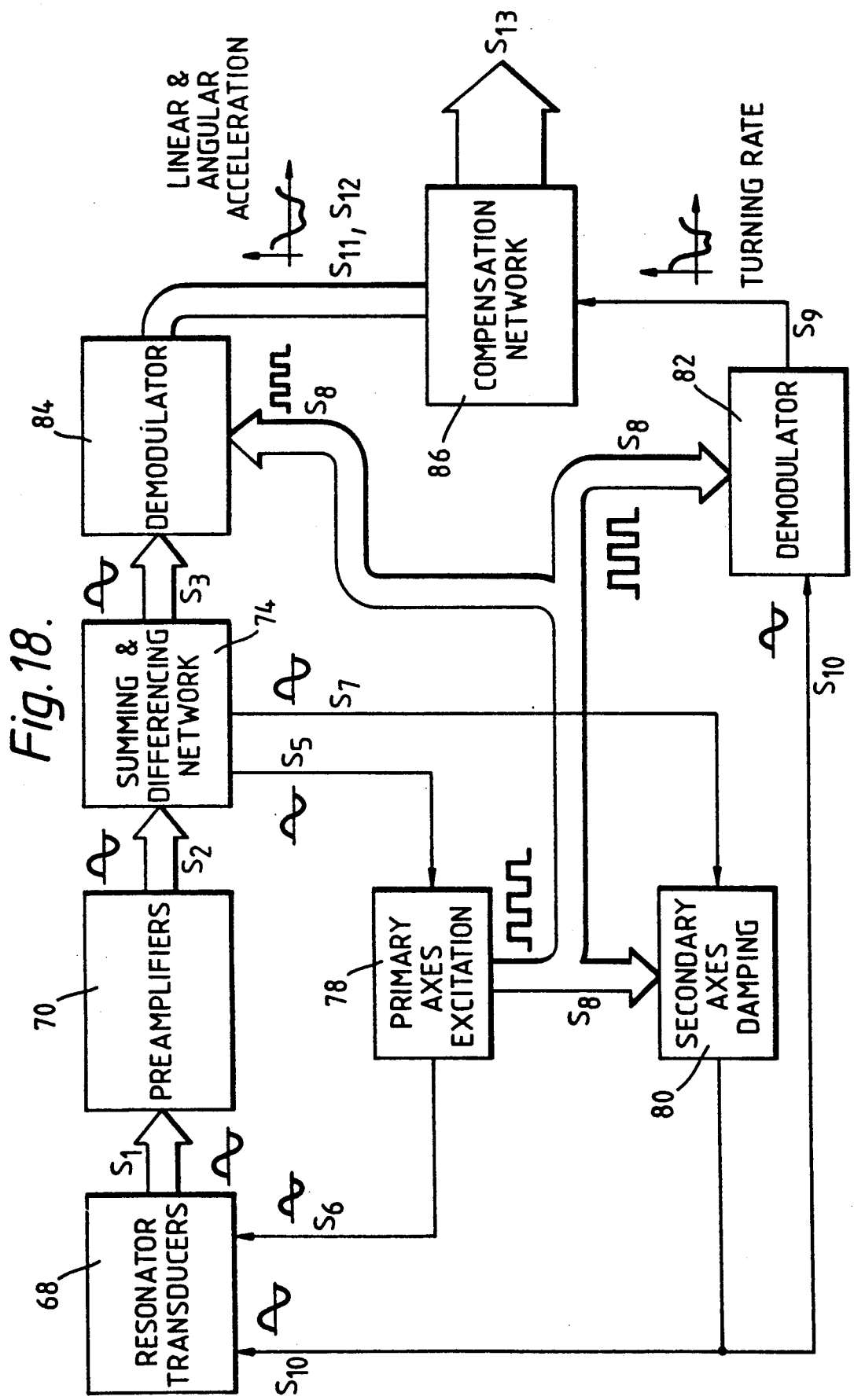
FIG. 18 shows a suitable circuit configuration for use with the resonator which enables sensing of applied turning rate as well as linear and angular acceleration.

FIG. 18 shows one example of a suitable circuit configuration which may be used to determine turning rate and linear and angular acceleration applied to the sensor. The signals 51 from the resonator transducers 68 at the primary and secondary axes (such as U1-U8 and L1-L8 described above) are analogue sinusoidal carrier signals, some of which may be amplitude modulated depending on acceleration and turning rate applied to the sensor. Signals $S_1$ are amplified and buffered by preamplifiers 70 to produce signals S2 which are passed to summing and differencing network 74. The network 74 performs appropriate addition and substraction (see table, for example) of input analogue signals $S_2$ depending on the transducer configuration so as to produce sinusoidal analogue signals $S_3$, $S_5$ and $S_7$. Signal $S_3$ is a sinusoid modulated in response to lateral movement and rocking motion of the resonator within its mount (and therefore representative of linear and angular acceleration). Signal $S_5$ corresponds to the detected primary cos $2\theta$ mode vibration of the resonator, and signal $S_7$ corresponds to the detected secondary cos $2\theta$ mode vibration of the resonator resulting from Coriolis-coupled vibrations from the primary mode. Signal $S_5$ is passed to the primary axes excitation unit 78 where, for example, the signal is phase shifted by 90° to produce signal $S_6$ which is applied to the resonator transducers 68 which excite the primary mode vibrations. Excitation unit 78 also converts signal $S_5$ into a square wave logic gating signal $S_8$, the purpose of which will be described later.

Signal $S_7$ is passed to secondary axes damping unit 80 along with logic gating signal $S_8$. The unit 80 operates in such a way that the damping signal output $S_{10}$ has a frequency equivalent to signal $S_8$, but with its amplitude set according to the value of signal $S_7$ in order to dampen rate coupled secondary vibrations.

Signal $S_{10}$ is also applied to demodulator 82 where it is demodulated with respect to logic gating signal $S_8$, the resultant signal $S_9$ being representative of turning rate.

Likewise, signal $S_3$ is applied to a second demodulator 84 where it is also demodulated with respect to logic gating signal $S_8$, the resultant signals $S_{11}$ and $S_{12}$ being representative of linear and angular acceleration respectively.

Any cross sensitivity between detected acceleration and turning rate in signals $S_9$, $S_{11}$ and $S_{12}$ may be compensated in unit 86 by correcting any linear vibration sensitivity in the signal $S_9$ representative of measured rate by using the acceleration signals $S_{11}$ and $S_{12}$. The sensor output signals $S_{13}$ representing angular acceleration, linear acceleration and turning rate may be in either analogue or digitized format.

In order to overcome likely signal crosstalk problems between the primary axes excitation and secondary axes detection, the drive may be applied in bursts and the pick-up monitored in the periods between drive bursts. This is feasible if the structure has high resonance Q and the drive burst duration is less than the decay time constant of the excited mode vibrations.

It should be noted that any shape of ring or hoop-like structure may be used in the fabrication of this type of inertial sensor provided that the substrate can be etched to ensure that the Eigenmodes excited and detected at primary and secondary axes have nearly identical Eigenfrequencies. With reference to the resonator supported by mechanical mounts such as "T"-bars or "L"-bars, it should be noted that the number of supports required may be varied according to the requirements and shape of the resonator structure.

It should also be noted that the configurations illustrated use the cos $2\theta$ mode as shown in FIG. 6. This mode is believed to be advantageous because it gives maximum radial displacement for a given rate input and excitation amplitude, although the sensor could use other modes, for example cos $3\theta$, cos $4\theta$, etc. It should be further noted that rings or hoop-like structures can be supported by a fluid mounting such as an air flow, or by means of electrostatic forces, electro-magnetic forces or by a membrane support.

We claim:

1. An inertial sensor comprising:
   a vibratory resonator having inner and outer peripheral portions extending around a common axis,
   excitation means for causing the resonator to vibrate,
   support means for supporting the resonator and for allowing the resonator to vibrate in response to said excitation means and for allowing the resonator to move relative to the support means in response to linear acceleration, angular acceleration and turning rate, said support means comprising a plurality of flexible beams; and
   transducer means for sensing movement of the resonator.

2. A sensor according to claim 1, wherein said flexible beams have a longitudinal stiffness less than a transverse stiffness of said resonator.

3. An inertial sensor comprising:
   a vibratory resonator having inner and outer peripheral portions extending around a common axis,
   excitation means for causing the resonator to vibrate,
   support means for supporting the resonator and for allowing the resonator to vibrate in response to said excitation means and for allowing the resonator to move relative to the support means in response to linear acceleration, angular acceleration and turning rate, and
   transducer means for sensing movement of the resonator, wherein said excitation means comprises a plurality of pairs of electrodes positioned around said resonator, each of said electrodes comprising a series of concentric electrode strips.

4. A sensor according to claim 3, wherein the strips of the respective series of concentric electrode strips of each pair of electrodes are radially offset.

5. An inertial sensor comprising:
   a vibratory resonator having inner and outer peripheral portions extending around a common axis,
   excitation means for causing the resonator to vibrate,
   support means for supporting the resonator and for allowing the resonator to vibrate in response to said excitation means and for allowing the resonator to move relative to the support means in response to linear acceleration, angular acceleration and turning rate, and
   transducer means for sensing movement of the resonator, wherein said excitation means is periodically inoperative and signals from said transducer means representative of movement of said resonator are monitored during the inoperative periods.

6. An inertial sensor comprising:
   a vibratory resonator having inner and outer peripheral portions extending around a common axis,
   excitation means for causing the resonator to vibrate,
   support means for supporting the resonator and for allowing the resonator to vibrate in response to said excitation means and for allowing the resonator to move relative to the support means in response to linear acceleration, angular acceleration and turning rate, and
   transducer means for sensing movement of the resonator, wherein signals from said transducer means representative of movement of said resonator are processed to produce a first signal representative of linear acceleration of said sensor and a second signal representative of turning rate of said sensor, said second signal being modified by said first signal in order to compensate any linear acceleration component in said second signal.

7. An inertial sensor comprising:
   a vibratory resonator having inner and outer peripheral portions extending around a common axis,
   excitation means for causing the resonator to vibrate, support means for supporting the resonator and for allowing the resonator to vibrate in response to said excitation means and for allowing the resonator to move relative to the support means in response to linear acceleration, angular acceleration and turning rate, and transducer means for sensing movement of the resonator, wherein signals from said transducer means representative of movement of said resonator are processed to produce a first signal representative of angular acceleration of said sensor and a second signal representative of turning rate of said sensor, said second signal being modified by said first signal in order to compensate of any angular acceleration component in said second signal.

8. An inertial sensor comprising:

a vibratory resonator having inner and outer peripheral portions extending around a common axis, excitation means for causing the resonator to vibrate, support means for supporting the resonator and for allowing the resonator to vibrate in response to said excitation means and for allowing the resonator to move relative to the support means in response to linear acceleration, angular acceleration and turning rate, said support means comprising a plurality of flexible beams, and transducer means for sensing movement of the resonator, wherein said resonator is planar.

* * * * *